US009803292B2

(12) United States Patent
Arnold et al.

(10) Patent No.: US 9,803,292 B2
(45) Date of Patent: Oct. 31, 2017

(54) BARRIER GUIDED GROWTH OF MICROSTRUCTURED AND NANOSTRUCTURED GRAPHENE AND GRAPHITE

(75) Inventors: Michael S. Arnold, Middleton, WI (US); Padma Gopalan, Madison, WI (US); Nathaniel S. Safron, Madison, WI (US); Myungwoong Kim, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 850 days.

(21) Appl. No.: 13/592,564

(22) Filed: Aug. 23, 2012

(65) Prior Publication Data

US 2013/0160701 A1 Jun. 27, 2013

Related U.S. Application Data

(60) Provisional application No. 61/527,214, filed on Aug. 25, 2011.

(51) Int. Cl.

| | |
|---|---|
| *C01B 31/04* | (2006.01) |
| *C30B 25/04* | (2006.01) |
| *B82Y 40/00* | (2011.01) |
| *H01L 29/16* | (2006.01) |
| *C30B 29/02* | (2006.01) |
| *H01L 21/02* | (2006.01) |
| *B82Y 30/00* | (2011.01) |

(52) U.S. Cl.
CPC ............ *C30B 25/04* (2013.01); *B82Y 30/00* (2013.01); *B82Y 40/00* (2013.01); *C01B 31/0453* (2013.01); *C30B 29/02* (2013.01); *H01L 21/0262* (2013.01); *H01L 21/02425* (2013.01); *H01L 21/02527* (2013.01); *H01L 21/02642* (2013.01); *H01L 21/02664* (2013.01); *H01L 29/1606* (2013.01); *C01B 2204/02* (2013.01); *C01B 2204/04* (2013.01)

(58) Field of Classification Search
CPC ..... B82Y 30/00; B82Y 40/00; C01B 31/0453; C01B 2204/02; C01B 2204/04; C30B 25/04; C30B 29/02; H01L 21/02425; H01L 21/02527; H01L 21/0262; H01L 21/02642; H01L 21/02664; H01L 29/1606
See application file for complete search history.

(56) References Cited

U.S. PATENT DOCUMENTS

| | | | |
|---|---|---|---|
| 8,268,180 B2 | 9/2012 | Arnold et al. | |
| 2009/0155561 A1* | 6/2009 | Choi | ............... B82Y 30/00 428/220 |
| 2010/0003462 A1* | 1/2010 | Kamins | ............... C30B 25/02 428/166 |

OTHER PUBLICATIONS

Graphene nanomesh, Jingwei Bai, Xing Zhong, Shan Jiang, Yu Huang, and Xiangfeng Duan, Nature Nanotechnology, vol. 5, Mar. 2010, 190-194.*

(Continued)

*Primary Examiner* — Michael Kornakov
*Assistant Examiner* — Hua Qi
(74) *Attorney, Agent, or Firm* — Bell & Manning, LLC (57) ABSTRACT

Methods for growing microstructured and nanostructured graphene by growing the microstructured and nanostructured graphene from the bottom-up directly in the desired pattern are provided. The graphene structures can be grown via chemical vapor deposition (CVD) on substrates that are partially covered by a patterned graphene growth barrier which guides the growth of the graphene.

10 Claims, 6 Drawing Sheets

(56) References Cited

OTHER PUBLICATIONS

Metal Nanodot Memory by Self-Assembled Block Copolymer Lift-Off, Augustin J. Hong, Chi-Chun Liu, Yong Wang, Jiyoung Kim, Faxian Xiu, Shengxiang Ji, Jin Zou, Paul F. Nealey and Kang L. Wang, Nano Lett. 2010, 10, 224-229.*

Evolution of Graphene Growth on Ni and Cu by Carbon Isotope Labeling, Xuesong Li, Weiwei Cai, Luigi Colombo and Rodney S. Ruoff, Nano Lett., vol. 9, No. 12, 2009, 4268-4272.*

Control and characterization of individual grains and grain boundaries in graphene grown by chemical vapour deposition, Qingkai Yu et al, Nature Materials 10, 2011, 443-449.*

Evolution of Graphene Growth on Ni and Cu by Carbon Isotope Labeling, Li et al, Nano Lett., vol. 9, No. 12, 2009, pp. 4268-4272.*

Metal Nanodot Memory by Self-Assembled Block Copolymer Lift-Off, Hong et al, Nano Lett. 2010, 10, 224-229.*

Graphene nanomesh, Bai et al, Nature Nanotechnology | vol. 5 | Mar. 2010, pp. 190-194.*

International Search Report and Written Opinion issued in PCT/US2012/051998, dated Feb. 18, 2013.

Li et al., Large-area synthesis of high-quality and uniform graphene films on copper foils, Science, vol. 324, Jun. 5, 2009, pp. 1312-1314.

Li et al., Evolution of Graphene Growth on Ni and Cu by Carbon Isotope Labeling, Nano Letters, vol. 9, No. 12, Aug. 27, 2009, pp. 4268-4272.

Cai et al., Thermal Transport in Suspended and Supported Monolayer Graphene Grown by Chemical Vapor Deposition, Nano Letters, vol. 10, Apr. 20, 2010, pp. 1645-1651.

Safron et al., Barrier-Guided Growth of Micro- and Nano-Structured Graphene, Advanced Materials, vol. 24, No. 8, Jan. 26, 2012, pp. 1041-1045.

Yu et al., Control and characterization of individual grains and grain boundaries in graphene grown by chemical vapour deposition, Nat. Mater., vol. 10, May 8, 2011, pp. 443-449.

Kim et al., Fabrication and Characterization of Large-Area, Semiconducting Nanoperforated Graphene Materials, Nano Lett., vol. 10, No. 4, Mar. 1, 2010, pp. 1125-1131.

Jiao et al., Facile synthesis of high-quality graphene nanoribbons, Nat. Nanotechnol., vol. 5, Apr. 4, 2010, pp. 321-325.

Cai et al., Atomically precise bottom-up fabrication of graphene nanoribbons, Nature, vol. 466, Jul. 22, 2010, pp. 470-473.

Chen et al., Contrasting Behavior of Carbon Nucleation in the Initial Stages of Graphene Epitaxial Growth on Stepped Metal Surfaces, Physical Review Letters, vol. 104, No. 18, May 6, 2010.

Mattevi et al., In-situ X-ray Photoelectron Spectroscopy Study of Catalyst-Support Interactions and Growth of Carbon Nanotube Forests, The Journal of Physical Chemistry C, vol. 112, No. 32, Jul. 22, 2008, pp. 12207-12213.

\* cited by examiner

BARRIER GUIDED GROWTH OF MICROSTRUCTURED AND NANOSTRUCTURED GRAPHENE AND GRAPHITE

CROSS-REFERENCE TO RELATED APPLICATIONS

The present application claims priority to U.S. Provisional Patent Application No. 61/527,214 that was filed Aug. 25, 2011, the entire contents of which is hereby incorporated by reference.

REFERENCE TO GOVERNMENT RIGHTS

This invention was made with government support under 0832760 awarded by the National Science Foundation. The government has certain rights in the invention.

BACKGROUND

The patterning of graphene is a powerful approach for tuning its physical and electronic structure and for controlling its integration into devices. Graphene patterned on the micron-scale has been employed to create ultrahigh frequency analog amplifiers, electrical interconnects, conduits for heat dissipation, and mechanical resonator membranes. At the nanometer-scale, the patterning of graphene modifies its electronic structure, opening up a band gap, thereby making it useful for semiconductor electronics and sensing. Nanostructured graphene materials are furthermore attractive for energy storage because of their ultrahigh surface area and the enhanced accessibility of the surfaces; and, nanoperforated graphene membranes with high pore density and flow conductance have been proposed as ideal ultrafiltration membranes.

A critical advantage of graphene, over other analogous, high-performance carbon materials such as nanotubes, is that its two-dimensional form factor naturally lends itself to patterning via scalable and standardized planar processing tools. Patterned graphene has typically been achieved by first exfoliating or growing graphene as a continuous membrane and then patterning it via subsequent top-down subtractive etching. A substantial disadvantage of top-down processing, however, is that it is limited in fidelity by the etching tools that are available, resulting in structural and chemical disorder that degrades graphene's exceptional properties, especially on the nanometer level.

The challenges presented by top-down processing have led to the exploration of superior bottom-up synthetic methods. However, bottom-up approaches have been limited by difficulties in controlling graphene growth orientation, assembly and pattern resolution.

SUMMARY

Methods for growing patterned, single-crystalline graphene are provided. The methods employ graphene growth barriers deposited on the surface of a substrate. These barriers block the growth of graphene and make it possible to grow graphene in tunable patterns having lateral feature dimensions on the micrometer or nanometer scale.

One illustrative aspect of the invention provides methods for growing patterned, single-crystalline graphene. The methods comprise the steps of depositing a graphene-growth barrier that defines a pattern on a substrate surface; and growing graphene on the substrate surface, around the graphene-growth barrier. The substrate surface can include a graphene-growth catalyst to catalyze the growth of the graphene. In the methods, graphene can be grown via chemical vapor deposition, wherein the growth of the graphene occurs laterally on the surface from one or more points of nucleation. Growth of the graphene can be non-epitaxial.

In some embodiments of the methods, depositing the graphene growth barrier comprises the steps of transferring a pre-patterned graphene-growth barrier template onto the substrate surface, depositing the graphene-growth barrier onto the substrate surface around the pre-patterned graphene-growth barrier template, and removing the pre-patterned graphene-growth barrier template. In these embodiments, the pre-patterned graphene-growth barrier template can comprise a self-assembled block copolymer film that defines a pattern. The step of depositing the graphene growth barrier onto the substrate surface can be accomplished by etching the pattern into the self-assembled block copolymer film by selectively removing portions of the self-assembled block copolymer film and then depositing the graphene growth barrier onto the substrate surface, around the remaining portions of the self-assembled block copolymer film.

Aluminum oxide is an example of a material from which the graphene-growth barriers can be formed. Copper is an example of a suitable graphene growth catalyst.

The methods can be used to make single layers of patterned graphene or multilayered stacks of patterned graphene.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

DETAILED DESCRIPTION

Methods for growing microstructured and nanostructured graphene by growing the microstructured and nanostructured graphene from the bottom-up, directly in the desired pattern are provided. The graphene structures can be grown via chemical vapor deposition (CVD) on catalytic substrates that are partially covered by patterned graphene growth barriers which guide the growth of the graphene.

An advantage of the barrier-guided CVD (BG-CVD) growth approach is that the edge structure of the graphene is controlled by the thermodynamics of graphene growth. Therefore, by using growth conditions in which edge roughness and dangling bonds are less thermodynamically stable than smooth edges, the present methods can provide graphene with edge roughness that is lower than the edge roughness of graphene patterned using top-down etching techniques. There are many advantages to lowering the edge roughness of graphene. For example, in nanoelectronics, one advantage of lower edge roughness is that the mobility of the nanostructured graphene should be much higher. In addition, for applications in which mechanical strength is important, the well-defined edges of the patterned graphene made with the present methods can provide graphene that is more robust than graphene made with top-down etching techniques, where edge roughness and defects have the potential to initiate crack propagation and failure.

Figure 1:
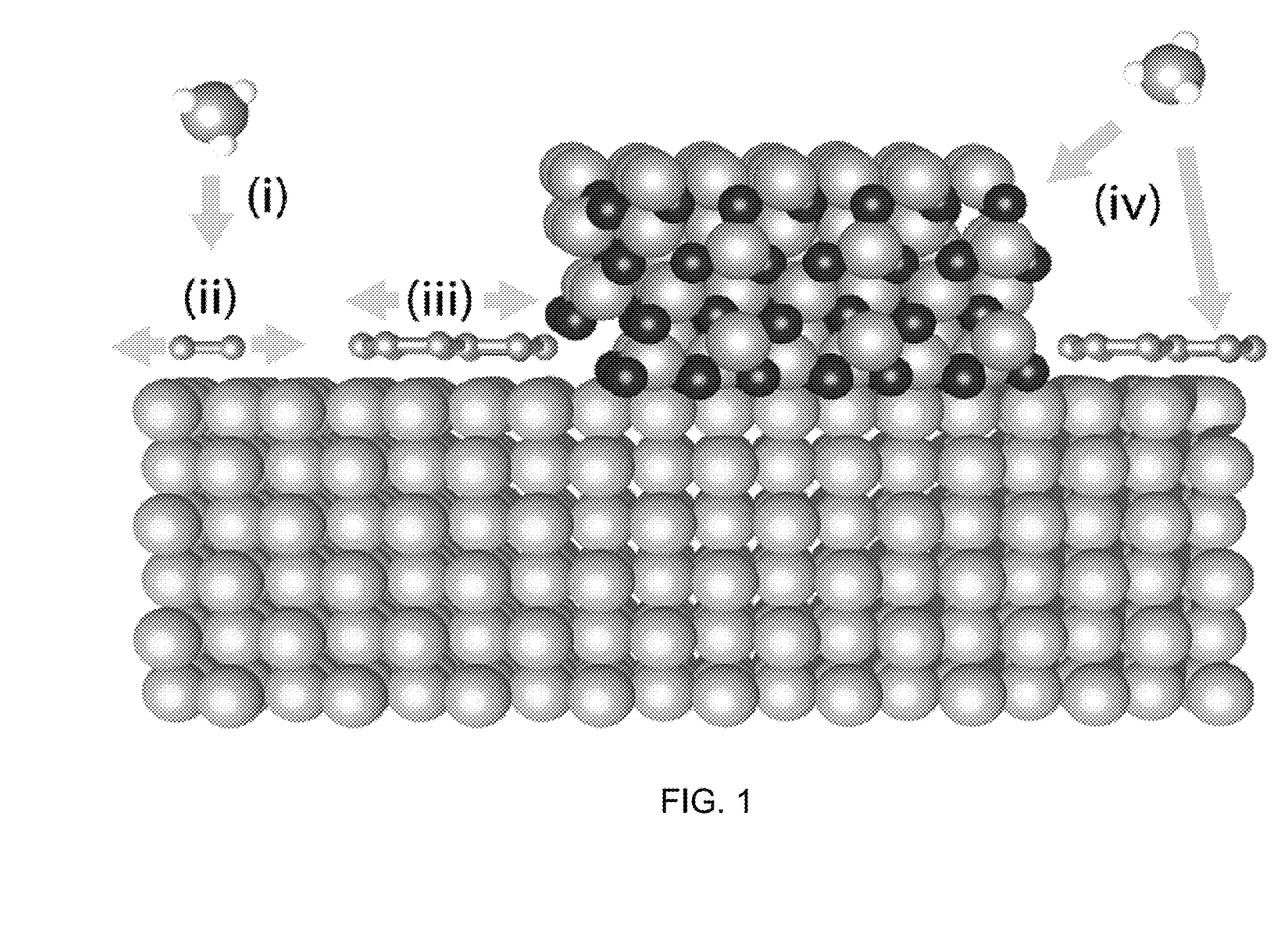
FIG. 1. Schematic of the barrier-guided chemical vapor deposition (BG-CVD) graphene growth process: (i) a carbon precursor molecule, such as methane, decomposes on a graphene-growth surface into atomic C or small molecular fragments of carbon, which (ii) diffuse and nucleate graphene, (iii) growing to cover those portions of the growth surface that are not covered by the graphene-growth barrier until (iv) the entire surface is covered by either graphene or graphene growth barrier and the carbon precursor can no longer decompose, terminating graphene growth.

The BG-CVD process is schematically depicted in FIG. 1. In this process, a carbon precursor species is used in a CVD process to grow graphene on the surface of a graphene-growth substrate. Prior to graphene growth, a film of a graphene-growth barrier, which defines a pattern, is deposited on the surface of the substrate. During the growth of graphene, the carbon precursor species decomposes selectively on the exposed regions of the graphene-growth substrate surface to produce atomic C or small fragments of carbon (FIG. 1(i)), which do not appreciably dissolve into the bulk of the growth substrate due to the substrates' low C solubility. The C instead laterally diffuses and preferentially accumulates on the exposed regions of the graphene-growth substrate surface until a supersaturation is reached and graphene nucleates (FIG. 1(ii)).

Following nucleation, the graphene crystallites grow up to the growth surface/growth barrier edge-interface (FIG. 1(iii)). At this stage, the supply of C becomes locally depleted due to the passivation of the underlying graphene-growth substrate surface by both the graphene and the graphene-growth barrier material, and after the entire graphene-growth substrate surface is passivated the catalytic decomposition of the carbon precursor species ceases, terminating the growth of graphene (FIG. 1(iv)). Notably, this growth process does not require epitaxial growth of the graphene on the substrate surface. Thus, the graphene can form crystallites with random orientations with respect to the underlying growth surface. Following BG-CVD, the patterned graphene can be transferred to another substrate via a temporary polymer support membrane and the growth surface and/or growth barrier can be selectively removed, leaving a free-standing, patterned graphene sheet.

The graphene grown by the present methods can be grown over large areas (e.g., 1 cm$^2$ or larger) and can include large-area, single-crystalline, patterned domains. For example, in some embodiments, the graphene includes single-crystalline domains with lateral dimensions of at least 2 μm, at least 5 μm, at least 10 μm and at least 100 μm.

The present methods can be carried out on the surface of any substrate suitable for growing graphene ("graphene-growth substrates"), including silicon carbide substrates and substrates having one or more surfaces composes of, or coated with, a graphene growth catalyst. Suitable graphene growth catalysts include metal catalysts, such as copper, nickel, ruthenium, rhenium, iridium, gold and platinum. The graphene-growth substrate surfaces are selected such that the C produced during the CVD process does not appreciably dissolve into the bulk substrate due to its low solubility in the substrate material. For example, Cu may be chosen as a growth substrate due to the extremely low solubility of C in Cu. (See Li, X. S., Cai, W. W., Colombo, L. & Ruoff, R. S. Evolution of Graphene Growth on Ni and Cu by Carbon Isotope Labeling. *Nano Lett.* 9, 4268-4272 (2009).) Another advantage of implementing BG-CVD on Cu is that it is self-passivating. The self-passivating nature of graphene growth means that once graphene nucleates and grows to completion in one particular region on a growth substrate, the growth will self-terminate in that region. Nucleation and growth will then proceed in other regions, until the growth on all regions has been completed. The preferential deposition and accumulation of C on the exposed Cu is driven by the relative inertness of the oxide and the strong Cu-C bonding energy ~5 eV. (See Chen, H., Zhu, W. & Zhang, Z. Contrasting Behavior of Carbon Nucleation in the Initial Stages of Graphene Epitaxial Growth on Stepped Metal Surfaces. *Physical Review Letters* 104, 186101 (2010).)

The carbon precursor species used in the CVD process is typically a low molecular weight hydrocarbon, such as methane. Although, other species suitable for producing carbon via CVD growth can also be employed.

The material used for the graphene-growth barrier has high temperature stability (e.g., stability at 800° C., 900° C. or 1000° C.) low carbon solubility and relative chemical inertness with respect to the graphene-growth substrate material and the carbon. Based on these criteria, polycrystalline aluminum oxide is a good selection for a graphene-growth barrier material. (See Foster, L. M., Long, G. & Hunter, M. S., Reactions Between Aluminum Oxide and Carbon: The $Al_2O_3$—$Al_4C_3$ Phase Diagram, *Journal of the American Ceramic Society* 39, 1-11 (1956).) However, other materials, including inorganic oxides such as silicon oxides, may also be employed; provided they meet the criteria presented above and can be disposed as a pattern-defining film on the graphene-growth surface. The height of the graphene-growth barrier should be sufficient to allow for the growth of at least a single layer of graphene on the substrate surface. By way of illustration only, the height of the growth barrier can be about 5 to about 20 nm.

Figure 2:
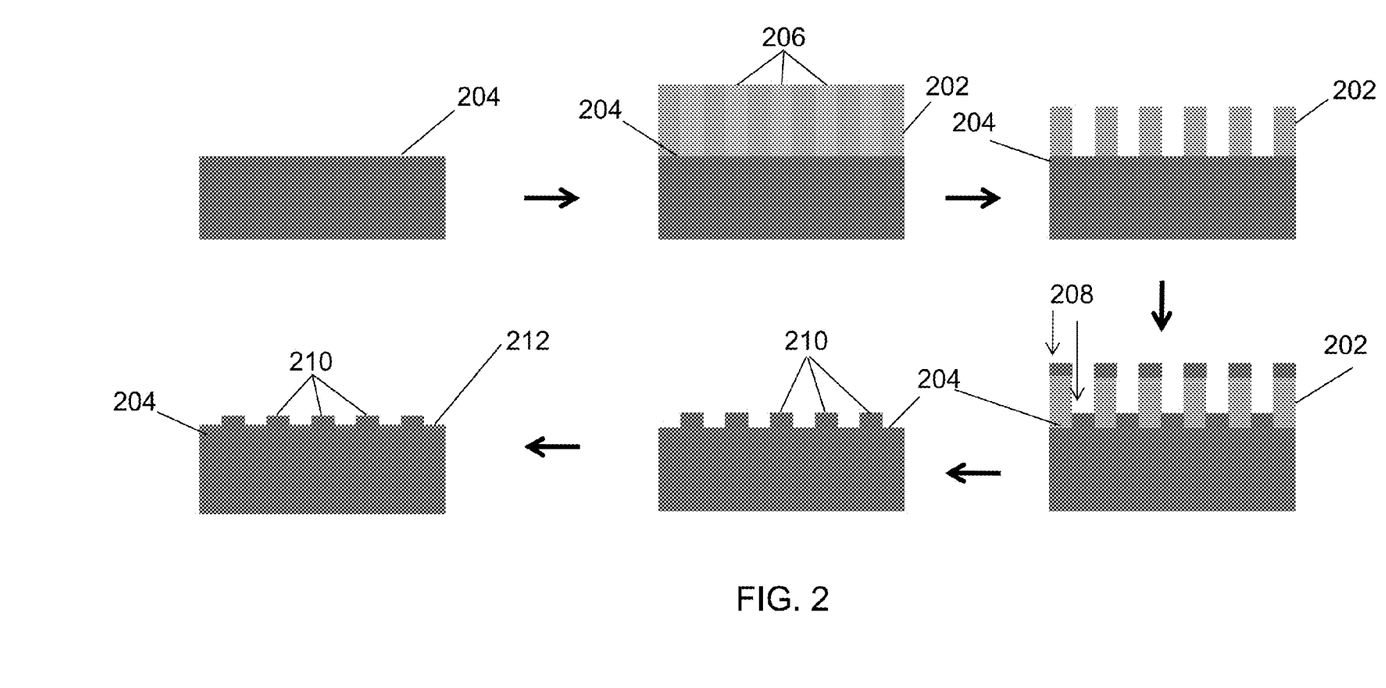
FIG. 2. Shows a schematic illustration of a method for forming a graphene-growth barrier on a graphene-growth substrate surface using block copolymer lithography.

The graphene-growth barrier may be patterned using known lithographic techniques, including block copolymer (BCP) lithography, nanosphere lithography, e-beam lithography, interference lithography and photolithography. One method for providing a patterned graphene-growth barrier on an underlying growth substrate is illustrated in FIG. 2. A more detailed description of the method can be found in the Examples, below. In this method, a self-assembled BCP film 202 which defines a pattern is transferred onto a graphene-growth surface 204 (second panel) using, for example, a thin film floating transfer technique. The pattern, which is defined by a collection of domains 206 in the self-assembled BCP, is then etched into the BCP film down to the graphene-growth substrate by selectively removing domains within BCP film (third panel). A graphene-growth barrier material 208 is then deposited over the BCP film where it forms the graphene-growth barrier 210 on the exposed surfaces of the graphene-growth substrate (fourth panel). The BCP film is then removed from the graphene-growth surface (fifth panel) and graphene 212 is grown on the growth surface, around the graphene-growth barrier, via BG-CVD (sixth panel).

The method depicted in FIG. 2 is well-suited for use on graphene-growth surfaces, such as metal foils, that are uneven and easily oxidized because it is difficult to grow masking layers directly upon such surfaces and also difficult to etch and deposit graphene-growth barrier materials on such surfaces with dimensional precision.

The BG-CVD process can be used to grow graphene in a broad range of patterns, including periodic patterns, aperiodic patterns, pre-designed patterns (e.g., images) or random patterns. The patterns may be continuous, or may include discrete and disconnected portions. Particularly useful patterns include those that provide for spatial confinement of electronic carriers or superlattice effects in graphene which open a band gap in the graphene. Such patterns include arrays of holes in a two-dimensional (2D) graphene sheet; aligned, narrow strips of graphene; and arrays of small graphene dots. Using the present methods, patterns having microscale or nanoscale dimensions can be fabricated. For the purposes of this disclosure, a pattern has microscale dimensions if it has at least one pattern feature (e.g., dot, stripe, hole, etc.) with a width or length dimension that is no greater than 1000 μm. This includes, for example, features having at least one width or length dimension of about 100 μm to about 1000 μm. For the purposes of this disclosure, a pattern has nanoscale dimensions if it has at least one pattern feature with a width or length dimension that is no greater than 100 nm. This includes, for example, features having at least one width or length dimension of about 1 nm to about 100 nm. In some embodiments, one or more features of the pattern will have one or more lateral dimensions of no greater than about 5 nm. These small dimensions can be achieved with resolutions of 2 nm or better—including resolutions of 1 nm or better.

The bottom-up, barrier-guided growth of graphene can be extended from the growth of single, patterned graphene sheets to the growth of patterned graphene stacks comprising multiple (e.g., ≥2, ≥10, ≥100, ≥1000 or even ≥1,000,000) patterned graphene sheets. When stacks of graphene sheets are grown, the graphene-growth barrier laterally restricts the graphene sheet-by-sheet, resulting in vertical columns of patterned bulk graphite with a high degree of inter-layer pattern replicability.

Figure 6:
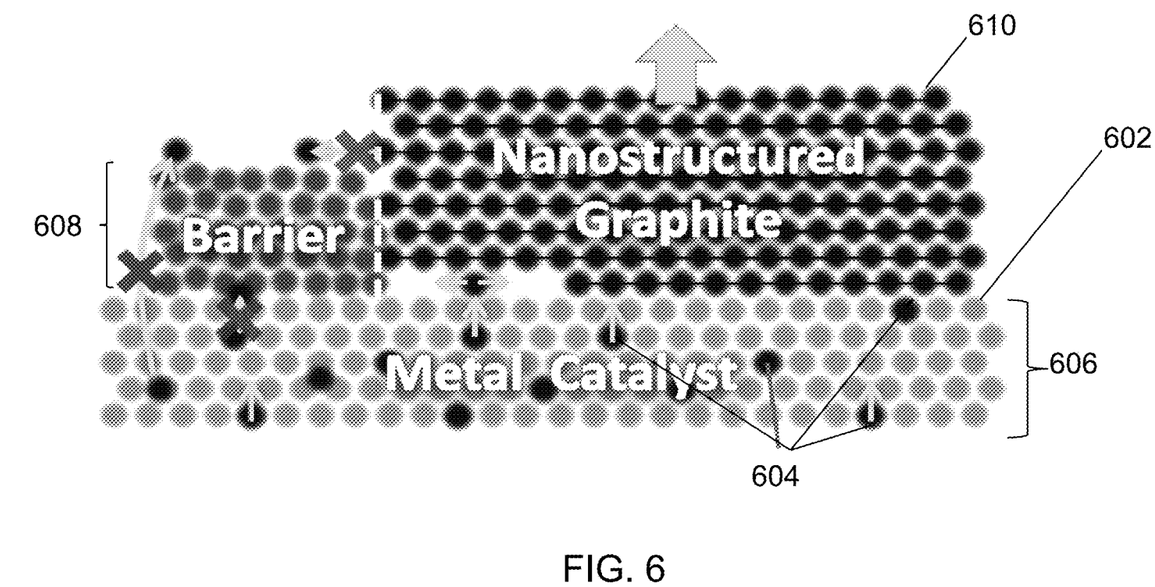
FIG. 6. Schematic of the barrier-guided growth of a multilayered graphene material.

FIG. 6 shows a schematic diagram of a method for the barrier-guided growth of multilayered graphene. The growth of graphene begins with the decomposition of a carbon precursor species (e.g., methane), catalyzed by the graphene-growth substrate surface 602. The carbon atoms 604 formed on the surface from the decomposition of the precursor species diffuse into the bulk of the substrate 606. Upon cooling, carbon loses its solubility and diffuses back to those portions of the growth surface that are not covered by the graphene-growth barrier 608 to form graphene 610. The carbon atoms cannot reach the surface under or over the graphene-growth barrier since because they have zero (or near zero) solubility in the graphene-growth barrier material (indicated by the crossed-out arrows in FIG. 6). Carbon atoms continue to precipitate from the substrate resulting in patterned, multilayer graphene growth. The carbon barrier growth materials used in this method and the types of patterns that can be achieved by this method may be the same as those described above for the growth of single-layered graphene sheets.

The type of graphene growth depicted in FIG. 6, which is based on the surface-segregation of carbon atoms following their precipitation from a substrate in which they are dissolved can be carried out on a variety of substrates. However, unlike the catalytic substrates on which single-layer graphene may be grown, the catalytic substrates for multi-layered graphene growth are able to dissolve carbon atoms to a significant extent. Suitable catalytic substrates include metals that form metal solutions of carbon. Such metals include, but are not limited to, nickel, iron, and other transition metals.

Multilayered graphene materials having very high aspect ratios can be grown using the barrier-guided growth technique, since each new layer of graphene forms at the bottom of the stack, having a pattern that is defined by the graphene-growth barrier. In this manner, each new layer of graphene will be grown with the same pattern as the layer before it. Accordingly, high surface area/volume ratio structures can be formed from the multilayered graphene materials for energy storage, optoelectronic and filtration applications.

EXAMPLE

The following example illustrates the BG-CVD growth of graphene on a Cu foil substrate.

Methods:

Aluminum Oxide Pattern Formation: Electron-beam lithography and block copolymer lithography were used to pattern aluminum oxide barriers directly on 25 μm thick Cu foil (Alfa Aesar).

Electron-Beam Lithography: PMMA (900PMMA-C2, Microchem) was spun at 2000 rpm onto the foil and patterned following standard procedures using a LEO-1530 FE-SEM operating at 20 kV for e-beam writing. 10 nm of aluminum oxide was deposited on the PMMA pattern via electron-beam evaporation with a 200 μtorr $O_2$ backfill, followed by liftoff by boiling in acetone for 5 minutes, bath ultrasonication for 2 minutes, and then washing with isopropanol.

Block Copolymer Lithography: A preassembled thin film of P(S-b-MMA) ($M_n$(PS)=46 k, $M_n$(PMMA)=21 k, PDI=1.09) with a PMMA cylindrical structure was deposited onto pre-annealed [at 1000° C. for 1 hour under a 340 sccm flow of forming gas (95% Ar, 5% $H_2$)] Cu foil via a thin film floating transfer technique. The sample was then exposed to UV radiation (1000 mJ/cm$^2$) to selectively degrade the PMMA cylinders. Degraded PMMA residue was removed by immersion in acetic acid for 2 minutes and rinsed with DI water. 20 W $O_2$ plasma was utilized for 18 sec. to remove any residues inside the holes and fully expose the Cu surface, followed by 10 nm aluminum oxide deposition in the hole arrays within the PS matrix by e-beam evaporation. The remaining PS matrix was removed by a liftoff process resulting in an aluminum oxide graphene-growth barrier defining an array of dots on a Cu graphene-growth substrate.

BG-CVD: The aluminum oxide/copper foil samples were loaded into a horizontal, 28 mm diameter quartz tube furnace, which was heated to 1000° C. under a 340 sccm flow of forming gas (95% Ar, 5% $H_2$). After annealing for 20 minutes, 66 ppm of $CH_4$ was introduced into the flow and graphene was allowed to grow for 4 hrs, followed by quickly cooling (~10° C./s until below 700° C.).

Graphene Transfer: BG-CVD grown graphene was transferred from the Cu foil by spin-coating PMMA as a structural support for the graphene and backside-etching the Cu by floating in a 0.2 M $FeCl_3$, 0.2 M HCl solution for several hours, using an initial 5 min bath ultrasonication to remove graphene from the backside of the Cu foil. For some experiments, the PMMA/graphene film was subsequently floated on a 5% HF aqueous solution for 2 days to remove the aluminum oxide barrier. The PMMA/graphene was then collected on a $Si/SiO_2$ (89 nm) wafer, followed by PMMA removal in boiling dichloromethane and washing with iso-propanol.

Characterization: Scanning electron microscopy was performed on a LEO-1530 field-emission SEM operating at 3 kV. Raman spectroscopy was conducted on an Aramis Horiba Jobin Yvon Confocal Raman Microscope with 633 nm laser light and ~1 $\mu m^2$ spot size. For electrical measurements, thermal evaporation was used to define electrodes (50 nm Au) and a sacrificial mask (50 nm Cu) for the graphene channels, utilizing a shadow mask. Exposed graphene was etched using a 50 W $O_2$ plasma for 20 sec in a Unaxis 790, followed by removal of the sacrificial mask in the copper etchant, resulting in 15×120 $\mu m$ (length×width) graphene transistors. Prior to all measurements, the graphene was treated with N-methyl pyrrolidone at 100° C. for 10 minutes and then washed with iso-propanol, which was found to reduce hole-doping.

Figure 3:
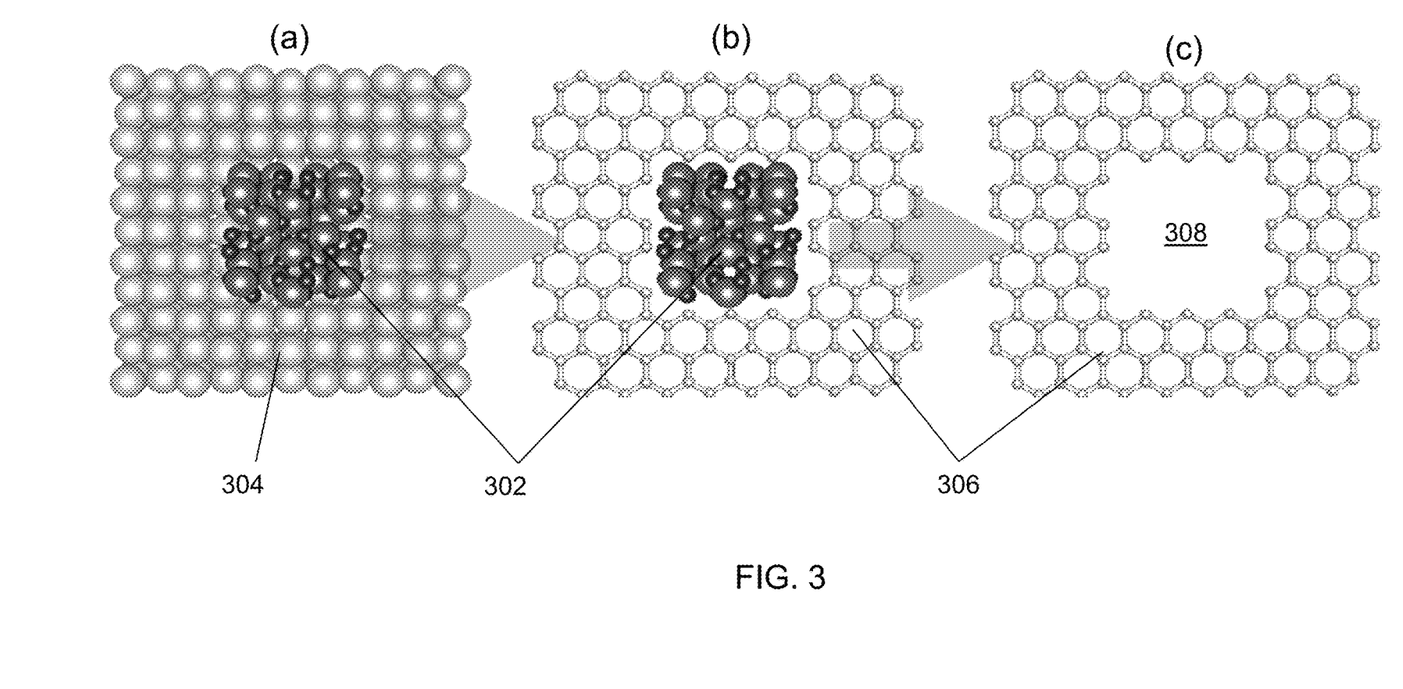
FIG. 3. Shows a schematic illustration of BG-CVD graphene growth with a 60 μm square aluminum oxide barrier 302 on a Cu substrate 304, (a); graphene 306 following BG-CVD, after Cu etch and transfer to a Si/SiO$_2$ substrate 208 for improved optical contrast, (b); and after both Cu and oxide barrier etch and transfer to a Si/SiO$_2$ substrate (c).

Results:

BG-CVD was implemented (active to passive) to create a variety of graphene structures at different scales including micron-scale boxes (FIG. 3), arbitrary patterns, nanoribbons, and nanoperforated graphene, showing the versatility and scalability of the method. The (60 $\mu m)^2$ boxes were employed in particular to better understand the growth mechanisms that enable BG-CVD, specifically to analyze the function of the barriers and the crystallinity of the resulting patterned graphene. Optical micrograph images of a (60 $\mu m)^2$ region of aluminum oxide barrier on a Cu foil immediately following CVD at 1000° C. were obtained. Both the resulting graphene on the exposed Cu and the aluminum oxide were nearly transparent. However, the exposed regions of the Cu surface were smoother and less pitted after growth, indicating a restructuring of the Cu surface at high-temperature. In contrast, the region of the Cu underneath the oxide barrier retained its initial coarse morphology, suggesting that the oxide is well-bonded to the underlying metal and frustrates its restructuring. After transferring the graphene and oxide from the Cu to a $Si/SiO_2$ (89 nm) substrate for enhanced optical contrast, single and few-layered graphene were observed on the previously unmasked regions contiguous to the barrier. After chemical etching of the oxide barrier, a sharp boundary was observed between the graphene and the previously masked Cu region observed as bare $Si/SiO_2$ in the optical micrograph.

Figure 4:
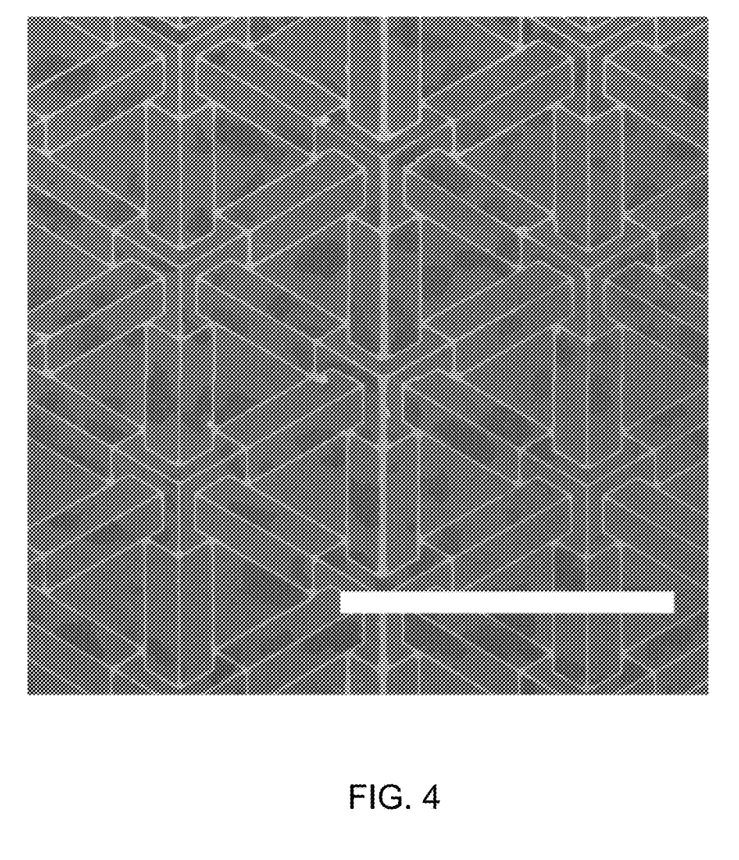
FIG. 4. SEM image of a BG-CVD-fabricated M. C. Escher pattern in graphene on a Si/SiO$_2$ substrate. The graphene is seen as darker grey and the Si/SiO$_2$ substrate as white, scale bar=20 μm.

In addition to the simple (60 $\mu m)^2$ box pattern, BG-CVD can be utilized to create substantially more complex patterns in graphene. For instance, BG-CVD can be implemented using barrier templates that incorporate many discrete and disconnected regions of exposed Cu, in which case the nucleation of graphene in each separate region will be stochastic (e.g. some regions will nucleate and grow before others). Nucleation and growth will then proceed in other regions, until all regions have finished. FIG. 4 shows a scanning electron microscopy (SEM) image of a patterned graphene sheet on a $Si/SiO_2$ substrate, which demonstrates the effectiveness of BG-CVD at reproducing a template with hundreds of discrete regions.

The graphene on the unmasked Cu is highly crystalline with low defect-density, as evidenced by a Raman 2D-band approximately twice the intensity of the G-band and the absence of a measurable D-band. In contrast, a non-graphitic carbonaceous Raman signal was detected in the barrier region following growth. The frequency and width of the D-band and absence of the 2D-band is consistent with that of small clusters of C or poly aromatic hydrocarbons rather than graphene. This C is simply removed concurrently with the etching of the aluminum oxide, as verified by the complete absence of a Raman signal from the previously masked region of the graphene structure. Importantly, the latter two observations demonstrate that BG-CVD growth is fundamentally distinct from previously reported lift-off mechanisms. Overall, the results showed the effectiveness of oxide barriers at terminating the growth of graphene crystallites that nucleate on the Cu, thereby preventing their continuation over the barriers, and at inhibiting the nucleation and growth of graphene at the buried Cu/oxide interfaces and on the exposed surfaces of the barriers.

To explore the resolution limits of the BG-CVD method on the nanoscale, graphene nanoribbons and nanoperforated graphene materials were fabricated using electron-beam and block copolymer (BCP) lithography, respectively, to create nanopatterned aluminum oxide barriers on Cu. To grow nanoperforated graphene from the bottom-up, BCP lithography was adopted to create a hexagonal array of 15 nm diameter aluminum oxide dots with a periodicity of 41 nm on Cu. Remarkably, these dots guide the growth of graphene through the network of ~25 nm channels of exposed Cu, resulting in large-area, bottom-up graphene perforated by arrays of hexagonally spaced holes. The dot-size and hole-size distributions differed only by 1 nm, revealing that the oxide barriers were able to terminate the growth of graphene with nearly atomic exactness at the Cu/oxide edge-interface. This data supports a conclusion that the BG-CVD strategy can be used to template nanostructured graphene materials with sub-5 nm features and <1 nm resolution.

Figure 5:
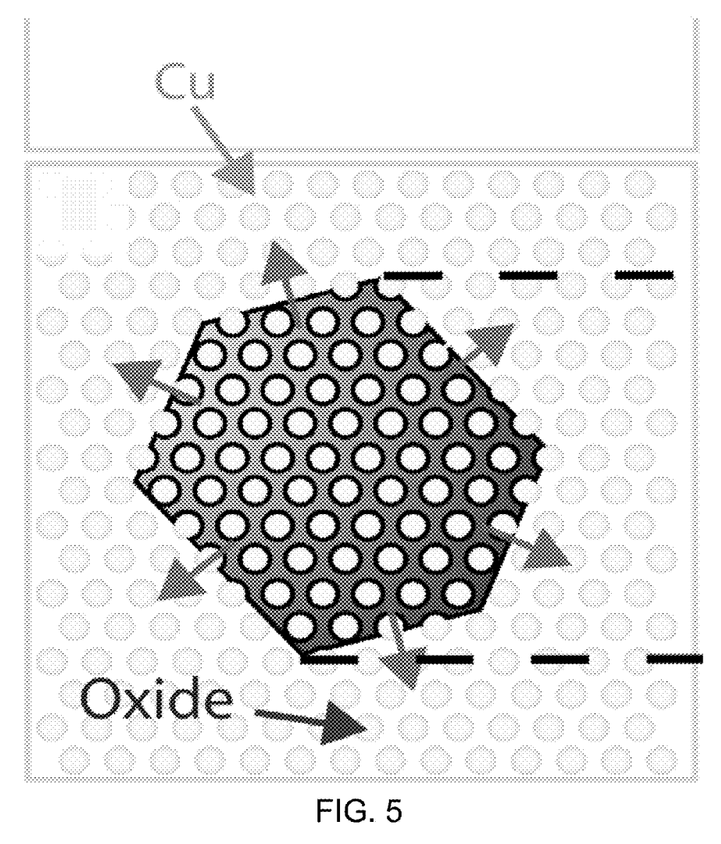
FIG. 5. Schematic of a hexagonal graphene crystallite growing around a graphene-growth barrier having a nanodot pattern on a graphene-growth surface.

In order to learn if the oxide barriers facilitate heterogeneous nucleation (which would be undesirable and result in highly polycrystalline graphene with nanoscale domains), the nucleation density on Cu surfaces was compared with, and without, nanoscale oxide dot arrays, prematurely terminating growth at ~30% coverage in both cases. On the bare Cu substrates, hexagonal graphene crystallites were observed with an average nucleation density of 0.02 $\mu m^{-2}$ (manually counted using an optical microscope), characteristic of atmospheric pressure graphene CVD in which zigzag edges are thought to be energetically favorable. (See Yu, Q. et al. Control and characterization of individual grains and grain boundaries in graphene grown by chemical vapour deposition. *Nat Mater* advance online publication, doi:http://www.nature.com/nmat/journal/vaop/ncurrent/abs/nmat3010.html#supplementary-information (2011).) On the Cu substrates with the oxide dots array, similar hexagonal graphene crystallites were observed, with a slightly smaller nucleation density of 0.005 $\mu m^{-2}$ (shown schematically in FIG. 5). This finding indicates that nucleation is largely unaffected by the oxide barriers and that as graphene grows through the network of 25 nm constrictions, the preference for the zigzag growth front is preserved, resulting in hexagonal faceting. When the growth was allowed to proceed to completion beyond the ~30% coverage, the domains of graphene originating from the different nucleation sites grew and zipped together to form a continuous nanoperforated graphene film with a large crystallite size similar to that of unpatterned CVD graphene.

The Raman spectrum of the continuous BG-CVD nanoperforated graphene was consistent with the high percentage of edge atoms at the circular perforations, which break the symmetry of the graphene crystalline lattice and result in the appearance of D- and D'-bands that are comparable in intensity to those in graphene nanoribbons of similar edge/interior atomic ratio. (See Ryu, S., Maultzsch, J., Han, M. Y., Kim, P. & Brus, L. E., Raman Spectroscopy of Lithographically Patterned Graphene Nanoribbons, *Acs Nano*, (2011) and Bischoff, D. et al., Raman spectroscopy on etched graphene nanoribbons, *Journal of Applied Physics* 109, 073710-073714 (2011).) The 2D-band indicates that the interior of the BG-CVD nanoperforated graphene is highly crystalline.

Charge transport through the bottom-up nanoperforated graphene was qualified in order to further characterize its structure and continuity, using a back gate to modulate the charge density. The bottom-up nanoperforated graphene showed ambipolar dependence of conductance on charge density, with a ON/OFF conductance modulation at room-temperature of 3.9±0.6 (14 devices), typical for the dimensions of nanoperforated graphene and small band gap ~15 meV produced in this study. The room-temperature hole mobility was estimated from the transconductance as 40±7 $cm^2/V \cdot s$, assuming a parallel-plate capacitance, which is found to be independent of temperature. It can be inferred from this data that the BG-CVD nanoperforated graphene is continuous across the boundaries between the crystallites. Furthermore, the temperature-independence of the mobility is distinctive of band-like transport dominated by an elastic scattering mechanism such as edge scattering from the circular perforations, suggesting that electronic conduction is not limited by interior disorder of the bottom-up graphene.

The Raman 2D-band, hexagonal faceting of the growing crystallites, and high electronic conductivity and mobility taken together indicate that the nanoperforated graphene is highly crystalline and continuous, demonstrating that the barrier materials are able to guide the growth of graphene without significant perturbation to its interior structure. Overall, the results presented here show that BG-CVD using the aluminum oxide/Cu system is a robust approach for bottom-up synthesis in which highly crystalline, micro- and nanostructured graphene materials can be achieved with 1 nm precision, over large areas.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for growing multilayered patterned, single-crystalline graphene comprising: depositing a graphene growth barrier that defines a pattern directly on a graphene growth catalyst surface; and growing multiple sheets of graphene in a vertical stack directly on the graphene growth catalyst surface, wherein the graphene sheets are grown directly, laterally next to and around the graphene growth barrier and the vertical stack of graphene is grown to a height that exceeds a height of the graphene growth barrier;

and further wherein each new sheet of graphene in the vertical stack forms at the bottom of the vertical stack and the sheets of graphene that are at a height that exceeds the height of the graphene growth barrier do not grow laterally, whereby a same pattern that is defined by the graphene growth barrier is also defined in all of the sheets of graphene in the stack.

2. The method of claim 1, wherein the growth barrier comprises aluminum oxide.

3. The method of claim 1, wherein depositing a graphene growth barrier comprises transferring a pre-patterned graphene growth barrier template onto the graphene growth catalyst surface, depositing the graphene growth barrier onto the graphene growth catalyst surface around the pre-patterned graphene growth barrier template, and removing the pre-patterned graphene growth barrier template.

4. The method of claim 3, wherein the pre-patterned graphene growth barrier template comprises a self-assembled block copolymer film that defines a pattern, and further wherein the step of depositing the graphene growth barrier onto the graphene growth catalyst surface comprises etching the pattern into the self-assembled block copolymer film by selectively removing portions of the self-assembled block copolymer film and depositing the graphene growth barrier onto the graphene growth catalyst surface around the remaining portions of the self-assembled block copolymer film.

5. The method of claim 1, wherein the graphene grown on the graphene growth catalyst surface comprises one or more single-crystalline domains having an area of at least 10 $\mu m^2$.

6. The method of claim 1, wherein the pattern in the graphene grown on the graphene growth catalyst surface has a feature with at least one lateral dimension of 5 nm or smaller.

7. The method of claim 6, wherein the pattern defined by the graphene growth barrier is an array of holes.

8. The method of claim 1, wherein the single-crystalline graphene comprises at least 10 sheets of graphene.

9. The method of claim 1, wherein the single-crystalline graphene comprises at least 1000 sheet of graphene.

10. The method of claim 1, wherein the graphene growth catalyst comprises a transition metal.

* * * * *